United States Patent
Park et al.

(10) Patent No.: US 9,087,711 B2
(45) Date of Patent: Jul. 21, 2015

(54) PATTERN STRUCTURE AND METHOD OF FORMING THE SAME

(71) Applicant: SAMSUNG ELECTRONICS CO., LTD., Suwon-si, Gyeonggi-do (KR)

(72) Inventors: Yoon Moon Park, Seoul (KR); Jae Hwang Sim, Seoul (KR); Keon Soo Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/834,847

(22) Filed: Mar. 15, 2013

(65) Prior Publication Data

US 2013/0200487 A1    Aug. 8, 2013

Related U.S. Application Data

(63) Continuation of application No. 12/824,480, filed on Jun. 28, 2010, now Pat. No. 8,436,412.

(30) Foreign Application Priority Data

Jun. 30, 2009  (KR) .................. 10-2009-0058768

(51) Int. Cl.
  *H01L 21/70*  (2006.01)
  *H01L 23/52*  (2006.01)
  *H01L 29/06*  (2006.01)
  *H01L 27/02*  (2006.01)
  *H01L 27/115*  (2006.01)

(52) U.S. Cl.
  CPC ........ *H01L 29/0657* (2013.01); *H01L 27/0207* (2013.01); *H01L 27/11521* (2013.01); *H01L 27/11526* (2013.01); *H01L 27/11529* (2013.01)

(58) Field of Classification Search
  USPC .................. 257/499, 508, 623, 501, 503
  See application file for complete search history.

(56) References Cited

U.S. PATENT DOCUMENTS

| | | | | |
|---|---|---|---|---|
| 6,469,360 | B1 * | 10/2002 | Jin ................................ | 257/503 |
| 7,202,548 | B2 * | 4/2007 | Lee ................................ | 257/532 |
| 7,604,926 | B2 * | 10/2009 | Kamigaki et al. ............ | 430/311 |
| 2003/0062550 | A1 | 4/2003 | Sekiguchi et al. | |
| 2003/0198086 | A1 * | 10/2003 | Shukuri ................... | 365/185.18 |
| 2004/0217414 | A1 | 11/2004 | Kim | |
| 2007/0034879 | A1 | 2/2007 | Park et al. | |
| 2007/0090445 | A1 | 4/2007 | Lee et al. | |
| 2007/0238053 | A1 | 10/2007 | Hashimoto | |

(Continued)

FOREIGN PATENT DOCUMENTS

| | | |
|---|---|---|
| JP | 2006-303022 A | 11/2006 |
| KR | 10-2007-0101155 A | 10/2007 |
| KR | 10-0874433 B1 | 12/2008 |

*Primary Examiner* — Khiem D Nguyen
*Assistant Examiner* — Wilner Jean Baptiste
(74) *Attorney, Agent, or Firm* — Lee & Morse, P.C.

(57) ABSTRACT

A pattern structure for a semiconductor device includes a plurality of first patterns, each of the first patterns extending in a first direction in the shape of a line, neighboring first patterns being spaced apart from each other by a gap distance, the plurality of first patterns including a plurality of trenches in parallel with the line shapes, respective trenches being between neighboring first patterns, the plurality of trenches including long trenches and short trenches alternately arranged in a second direction substantially perpendicular to the first direction, and at least a second pattern, the second pattern being coplanar with the first pattern, end portions of the first patterns being connected to the second pattern.

13 Claims, 16 Drawing Sheets

(56) References Cited

U.S. PATENT DOCUMENTS

| | | |
|---|---|---|
| 2008/0002471 A1 | 1/2008 | Lee |
| 2008/0220600 A1 | 9/2008 | Alapati et al. |
| 2008/0280443 A1* | 11/2008 | Yang .......................... 438/694 |
| 2009/0117739 A1 | 5/2009 | Shin et al. |
| 2009/0303797 A1 | 12/2009 | Sugimae et al. |

* cited by examiner 220a  220b

PATTERN STRUCTURE AND METHOD OF FORMING THE SAME

CROSS REFERENCE TO RELATED APPLICATION

This is a continuation application based on pending application Ser. No. 12/824,480, filed Jun. 28, 2010, the entire contents of which is hereby incorporated by reference.

BACKGROUND

1. Field

Example embodiments relate to a pattern structure and a method of forming the same.

2. Description of the Related Art

Generally, a very fine pattern having a critical dimension less than about 40 nm is difficult to form in a manufacturing process of a semiconductor device due to resolution limitations of a photolithography process.

SUMMARY

It is a feature of an embodiment to provide a fine pattern structure for a semiconductor device, which may be formed through a single photolithography process.

It is another feature of an embodiment to provide a method of forming the above fine pattern structure for a semiconductor device.

At least one of the above and other features and advantages may be realized by providing a pattern structure for a semiconductor device, including a plurality of first patterns, each of the first patterns extending in a first direction in the shape of a line, neighboring first patterns being spaced apart from each other by a gap distance, the plurality of first patterns including a plurality of trenches in parallel with the line shapes, respective trenches being between neighboring first patterns, the plurality of trenches including long trenches and short trenches alternately arranged in a second direction substantially perpendicular to the first direction, and at least a second pattern, the second pattern being coplanar with the first pattern, end portions of the first patterns being connected to the second pattern.

The pattern structure may further include a third pattern spaced apart from the first and second patterns, the third pattern having a width larger than those of the first patterns.

The second pattern may include a first width measured from an end portion of a short trench and a second width measured from an end portion of a long trench.

The first and second patterns may include an active region of a semiconductor substrate, and a conductive line and/or a contact plug may be arranged on the second pattern.

The first and second patterns may include an active region of a semiconductor substrate, and the trenches may have an isolation pattern therein.

The first and second patterns may include a semiconductor material, and the isolation pattern may include an oxide.

At least one of the above and other features and advantages may also be realized by providing a method of forming a pattern structure, the method including forming a plurality of first sacrificial patterns and at least one second sacrificial pattern coplanar with the first pattern on an object layer in such a manner that each of the first sacrificial patterns extends in the shape of a line in a first direction, the first sacrificial patterns being spaced apart from each other in a second direction, end portions of the first sacrificial patterns being connected to the second sacrificial pattern, forming spacers on the sidewalls of the first patterns and the second pattern, removing the first pattern from the object layer so that the spacers and the second pattern remain on the object layer, and partially removing the object layer by an etching process using the spacers and the second pattern as an etching mask to thereby form a plurality of first patterns and at least one second pattern coplanar with the first pattern such that the first patterns are shaped into a line, respectively, and are spaced apart from each other by a gap distance, so that a plurality of trenches extends in parallel with the line between neighboring patterns, the trenches including long trenches and short trenches alternately arranged in a direction substantially perpendicular to the line.

The method may further include forming a third sacrificial pattern spaced apart from the first and second sacrificial patterns, the third sacrificial pattern having a width larger than those of the first sacrificial patterns.

The plurality of first sacrificial patterns may be removed from the object layer without removal of the third sacrificial pattern.

Forming the first and second sacrificial patterns may include sequentially forming a first thin layer, a second thin layer, and a photoresist pattern on the object layer, forming a second thin pattern by patterning the second thin layer using the photoresist pattern as a mask, and partially removing the first thin layer by an etching process using the second thin pattern as an etching mask to thereby form a first thin pattern. The first sacrificial pattern may include the first thin pattern and the second thin pattern having a thickness smaller than that of the first thin pattern, and the second sacrificial pattern may include the first thin pattern and the second thin pattern.

The second thin pattern of the first sacrificial pattern may be removed from the first thin pattern while the second thin pattern of the second sacrificial pattern still remain on the first thin pattern after formation of the spacers.

The method may further include forming one of a conductive line and a contact plug on the second pattern. The object layer may include a semiconductor substrate.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
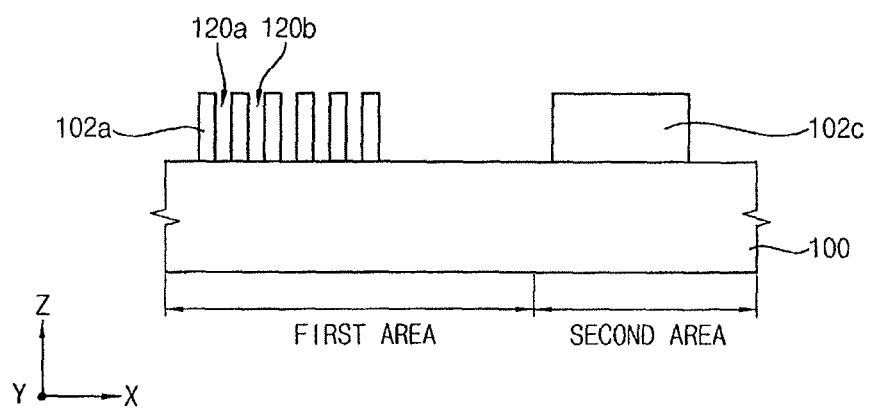
FIG. 1 illustrates a cross-sectional view of a pattern structure for a semiconductor device in accordance with a first example embodiment.

Korean Patent Application No. 10-2009-0058768, filed on Jun. 30, 2009, in the Korean Intellectual Property Office, and entitled: "Pattern Structure and Method of Forming the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions of layers and regions may be exaggerated for clarity of illustration.

It will be understood that when an element or layer is referred to as being "on," "connected to," or "coupled to" another element or layer, it can be directly on, connected, or coupled to the other element or layer, or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Embodiments may provide a pattern structure, which may be used for, e.g., a NAND flash memory device, and a method of manufacturing the same. Further, example embodiments may provide a pattern structure as a mask pattern for forming an active structure for a NAND memory device, and a method of forming the pattern structure. Example embodiments may also provide a NAND flash memory device having high capacitance and a method of manufacturing the NAND flash memory device using the pattern structure.

Embodiment I

Figure 2:
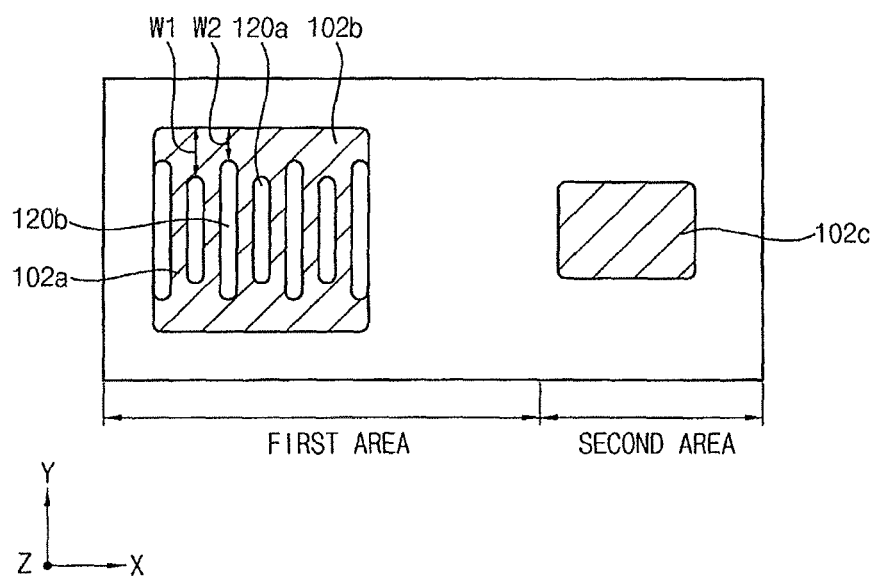
FIG. 2 illustrates a plan view of the pattern structure shown in FIG. 1.

FIG. 1 illustrates a cross-sectional view of a pattern structure for a semiconductor device in accordance with a first example embodiment and FIG. 2 illustrates a plan view of the pattern structure shown in FIG. 1.

Referring to FIGS. 1 and 2, a first pattern 102a may be arranged on a first area of a substrate 100, which may be, or may include, a semiconductor. For example, the first pattern 102a may have a line shape extending in a first direction (e.g., the Y-axis direction in FIGS. 1 and 2) and a plurality of the first patterns 102a may be spaced apart from each other by a gap space in a second direction (e.g., the X-axis direction in FIGS. 1 and 2) substantially perpendicular to the first direction. Thus, a plurality of the first patterns 102a may be arranged as a line-and-space configuration on the substrate 100. In FIGS. 1 and 2, six of the first patterns 102a are shown. The first pattern 102a may include an additional pattern formed on the substrate 100 and an integrated pattern formed at portions of the substrate itself.

A width of the first line-shaped pattern 102a and a gap distance of the gap space between the neighboring first patterns 102a may be reduced to a marginal width and a marginal distance corresponding to a resolution limit of a photolithography process. A ratio of the gap distance with respect to the width may be about 1:0.8 to about 1:1.2. In the present example embodiment, the ratio of the gap distance with respect to the width may be about 1:1, and thus the width of the first pattern 102a may be the same size as the gap distance of the neighboring first patterns 102a.

Hereinafter, the gap space between the neighboring first patterns 102a may be referred to as trench 120a or 120b. However, it is to be understood that the trench is an example of the gap space and is not to be construed as limited to the trench, as would be known to one of ordinary skill in the art.

In FIGS. 1 and 2, three of the trenches 120a are shown and four of the trenches 120b are shown. For the sake of reference, a first trench may be identified as an odd numbered trench 120b, an immediately adjacent trench may be identified as an even numbered trench 120a, etc.

The trenches 120a and 120b may have different lengths along the first direction, i.e., in the Y-axis direction in accordance with positions thereof. As shown in FIG. 2, an even-numbered trench 120a has a length along the first direction different from that of an odd-numbered trench 120b, and thus end portions of the even-number trench 120a may be located at positions that are not aligned with those of the odd-numbered trench 120b. In the present example embodiment, the length of the even-numbered trench 120a may be smaller than that of the odd-numbered trench 120b.

A second pattern 102b may be arranged on the first area of the substrate 100 in such a configuration that the end portions of the first patterns 102a may be connected to corresponding portions of the second pattern 102b. For example, the first and the second patterns 102a and 102b may become one body and may include the same material. Thus, the first and second patterns 102a and 102b may be defined by the isolated trenches 120a and 120b, respectively.

The shape of the second pattern 102b may be varied in accordance with the trenches 120a and 120b. As shown in FIG. 2, a first width W1 of the second pattern 102b to the end portion of the even-numbered trench 120a may be different from a second width W2 of the second pattern 102b to the end portion of the odd-numbered trench 120b.

The second pattern 102b may be connected to both of the end portions of the first pattern 102a, as shown in FIG. 2. However, the second pattern 102b may also be connected to one of the end portions of the first pattern 102a, as would be known to one of ordinary skill in the art. For example, the width of the second pattern 102b may be larger than the length of the first pattern 102a.

In the present example embodiment, the first width W1 of the second pattern 102b measured from the end portion of the even-numbered trench 120a may be larger than the second width W2 of the second pattern 102b measured from the end portion of the odd-numbered trench 120b.

A plurality of the first patterns 102a may be arranged in a unit distance along the second direction. Thus, the first and second patterns 102a and 102b, and the first and second trenches 120a and 120b, may be formed into a unit pattern structure on the first area of the substrate 100. The unit pattern structure may be defined by both outermost peripheral first patterns 102a located at both edge portions of the unit pattern structure. Though not shown in figures, the outermost peripheral first patterns 102a may have widths larger than that of the rest of the first patterns 102a, to thereby improve structural stability of the first patterns 102a.

A third pattern 102c may be arranged on a second area of the substrate 100 and may have a width significantly larger than those of the first patterns 102a. The second area of the substrate 100 may be spaced apart from the first area of the substrate 100, in which the first and second patterns 102a and 102b may be arranged by a distance.

For example, the first area may include a cell area of a semiconductor device having relatively high pattern density and the second area may include a peripheral area of a semiconductor device having relatively low pattern density.

In the present example embodiment, the width of the third pattern 102c may be about four times the width of the first pattern 102a. The third pattern 102c may be coplanar with the first and second patterns 102a and 102b. The third pattern 102c may include the same material as the first and second patterns 102a and 102b.

Figure 3A:
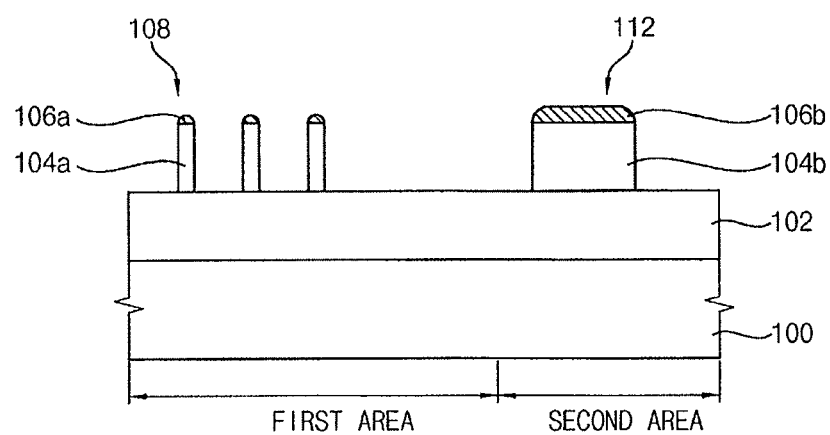
FIGS. 3A to 8B illustrates views of the processing steps for a method of forming the pattern structure shown in FIGS. 1 and 2.

FIGS. 3A to 8B illustrates views of stages in a method of forming the pattern structure shown in FIGS. 1 and 2. In FIGS. 3A to 8B, a suffix of the capital letter 'A' denotes a cross-sectional view illustrating a stage in a method of forming the pattern structure in FIGS. 1 and 2, and a suffix of the capital letter 'B' denotes a plan view illustrating a temporary structure corresponding to the stage shown in each figure designated by the corresponding suffix 'A.' Particularly, FIG. 3A illustrates a cross-sectional view taken along a line I-I' of FIG. 3B, and so forth.

Figure 3B:
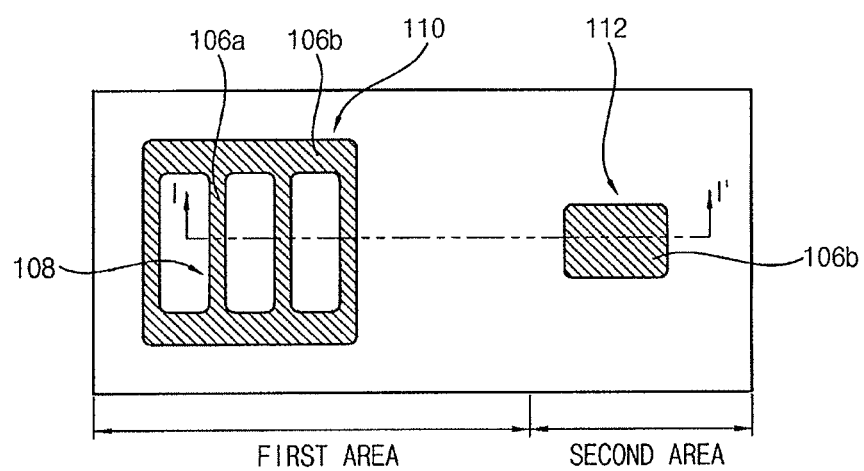

Referring to FIGS. 3A and 3B, an insulation layer 102 may be formed on the substrate 100 including the first and second areas. In the present example embodiment, the insulation layer 102 may be an object layer against which an etching process may be performed, and thus the pattern structure of the present example embodiment may be formed on the substrate 100.

The insulation layer 102 may include a silicon oxide layer formed by, e.g., a chemical vapor deposition (CVD) process. Examples of silicon oxide for the insulation layer may include BPSG, TOSZ, oxide deposited by HDP process, TEOS deposited by PECVD process, etc.

The first area of the substrate 100 may have relatively high pattern density and the second area of the substrate 100 may have relatively low pattern density. A plurality of the first patterns 102a shaped into a line, respectively, and the second pattern 102b connected to end portions of the first patterns 102a may be formed on the first area of the substrate 100. The third pattern 102c having a relatively larger width that those of the first and second patterns 102a and 102b may be arranged on the second area of the substrate 100. For example, the first area may include a cell area of the substrate 100 and the second area may include a peripheral area of the substrate 100.

A first thin layer (not shown) may be formed on the insulation layer 102 as an etching mask layer. For example, the first thin layer may include a polymer and thus may be easily removed from the first thin layer by an ashing process or a strip process. In the present example embodiment, the first thin layer may include a spin-on-hard mask layer (SOH) and/or a carbonized spin-on-hard mask layer (C-SOH).

A second thin layer (not shown) may be formed on the first thin layer. For example, the second thin layer may include silicon oxynitride or silicon nitride deposited onto the first thin layer.

Then, a photoresist layer may be formed on the second thin layer and may be patterned into a photoresist pattern. For example, a first photoresist pattern may be formed on the first area of the substrate 100 and a second photoresist pattern may be formed on the second area of the substrate 100. The second photoresist pattern may have a width larger than that of the first photoresist pattern. A photolithography process may be performed on the second thin layer a single time, and no more photolithography processes may be performed in subsequent processes.

For example, the first photoresist pattern may include a plurality of line-shaped patterns repeatedly arranged on the first area of the substrate along a second direction and a connection pattern connected with end portions of the line-shaped patterns. Each of the line-shaped patterns may extend in a first direction substantially perpendicular to the second direction. A width of the line-shaped pattern may be substantially the same as that of the first pattern 102a. The gap distance between the neighboring line-shaped patterns may be about three times the gap distance between the neighboring first patterns 102a. In the present example embodiment, the first photoresist pattern may be formed in various shapes in accordance with the arrangement of the trenches. The width of the connection pattern may be larger than that of the line-shaped pattern.

The second thin layer may be etched off from the first thin layer by a first anisotropic etching process using the first and second photoresist patterns as an etching mask, to thereby form second thin patterns 106a and 106b on the first thin layer. Then, the first thin layer may be etched off from the substrate 100 by a second anisotropic etching process using the second thin patterns 106a and 106b as an etching mask, to thereby form first patterns 104a and 104b on the substrate 100. Consequently, sacrificial patterns 108, 110, and 112 may be formed on the substrate 100, in which the first and second thin patterns 104a and 106a and 104b and 106b may be sequentially stacked on the first and second areas of the substrate 100, respectively.

A plurality of first sacrificial patterns 108 may be formed into a line-and-space structure on the first area of the substrate 100, and each of the sacrificial patterns 108 may extend in the first direction. The first sacrificial patterns 108 may be spaced apart from each other by a gap distance in the second direction.

A second sacrificial pattern 110 may also be formed on the first area of the substrate 100 in such a configuration that end portions of the first sacrificial patterns 108 may be connected with the second sacrificial pattern 110. The second sacrificial pattern 110 may have a width larger than those of the first sacrificial patterns 108.

A third sacrificial pattern 112 may be formed on the second area of the substrate 100. The third sacrificial pattern 112 may have a width significantly larger than those of the first and the second sacrificial patterns 108 and 110.

The anisotropic etching process may cause significantly more damage to the second thin pattern 106a on the first area of the substrate 100 than the second thin pattern 106b on the second area of the substrate 100 due to a three dimensional effect, because the second thin pattern 106a on the first area of the substrate 100 may be significantly thinner than the second thin pattern 106b on the second area of the substrate 100. Thus, the thickness of the second patterns 106a and 106b may be varied in accordance with the width of the sacrificial patterns 108 and 110, as shown in FIG. 3A.

In the present example embodiment, the second thin patterns 106a of the first sacrificial pattern 108 may have a relatively small thickness, and the second thin patterns 106b of the second and third sacrificial patterns 110 and 112 may have a relatively large thickness.

As shown in FIG. 3B, the second sacrificial pattern 110 may be formed to have a width larger than that of the first sacrificial pattern 108. In addition, both of the outermost peripheral first sacrificial patterns 108 may have a larger width than the rest of the first sacrificial patterns 108.

Each of the first sacrificial patterns 108 may have a marginal width corresponding to the resolution limitation of a photolithography process. Further, the gap distance between the first sacrificial patterns 108 adjacent to each other may be about three times the width of the marginal width of the first sacrificial patterns 108, and thus a pair of etching mask patterns may be formed in the gap space between the first sacrificial patterns 108.

Figure 4A:
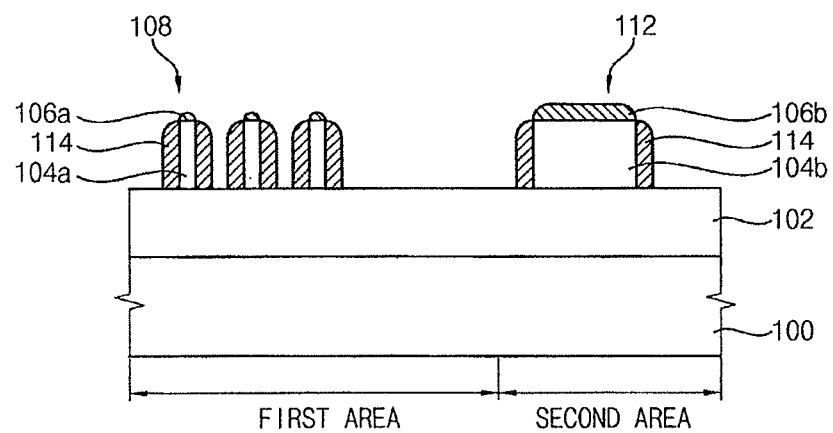
Figure 4B:
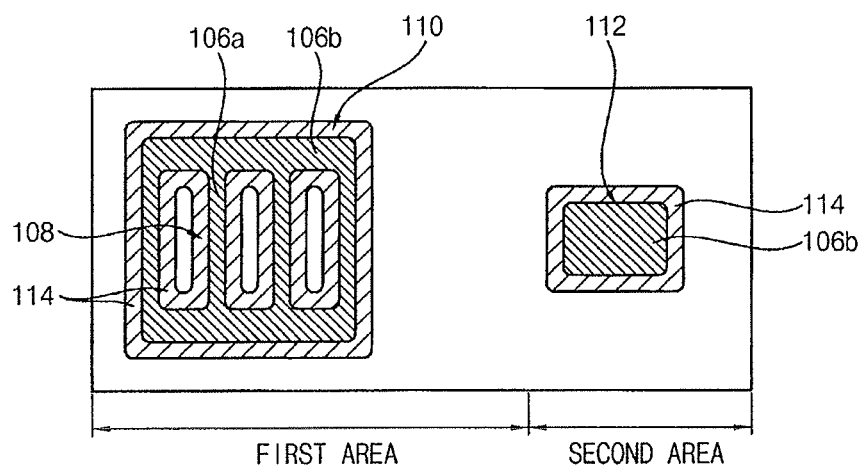

Referring to FIGS. 4A and 4B, a spacer layer (not shown) may be formed on the insulation layer 102, and on surfaces of the first, second, and third sacrificial patterns 108, 110, and 112. For example, silicon oxide may be deposited onto the substrate 100 on which the sacrificial patterns 108, 110, and 112, and the insulation layer 102 may be formed.

Then, the spacer layer may be partially removed by an anisotropic etching process, to thereby form spacers on sidewalls of the first, second, and third sacrificial patterns 108, 110, and 112. The spacer may be shaped into an elliptical ring on the sidewalls of the first sacrificial pattern 108 of which the major axis may extend in the first direction.

Figure 5A:
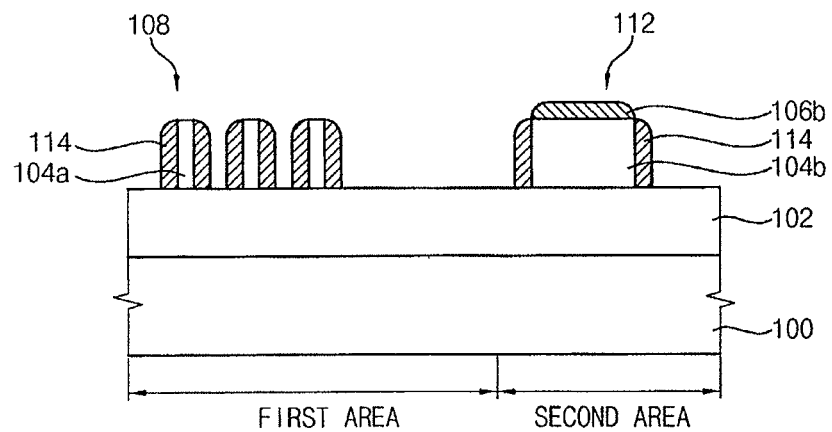
Figure 5B:
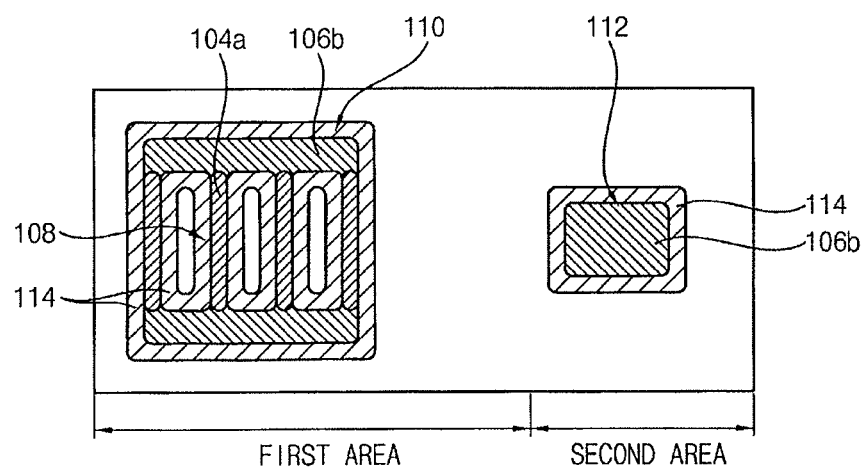

Referring to FIGS. 5A and 5B, the second thin pattern 106a of the first sacrificial pattern 108 may be removed from the substrate, while the second thin pattern 106b of the second and third sacrificial patterns 110 and 112 may remain on the substrate 100.

As described above, the second thin pattern 106a of the first sacrificial pattern 108 may have a relatively small thickness, and the second thin pattern 106b of the second and third sacrificial patterns 110 and 112 may have a relatively large thickness. Thus, when the second thin patterns 106a and 106b are etched at the same time by an etching process without an additional etching mask, the second thin pattern 106a of the first sacrificial pattern 108 may be removed from the substrate while the second thin patterns 106b of the second and the third sacrificial patterns 110 and 112 may substantially remain on the substrate 100. Therefore, when the etching process may be completed without any etching mask, the first sacrificial pattern 108 may merely include the first thin pattern 104a, while the second and the third sacrificial patterns 110 and 112 may include both of the first and second thin patterns 104b and 106b.

Figure 6A:
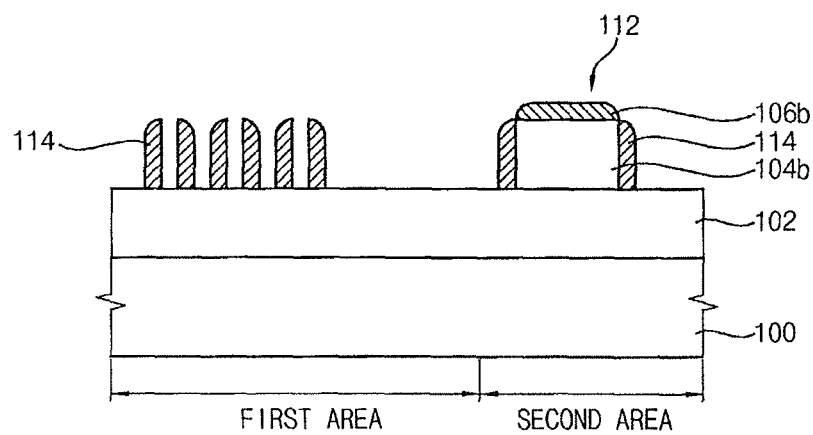
Figure 6B:
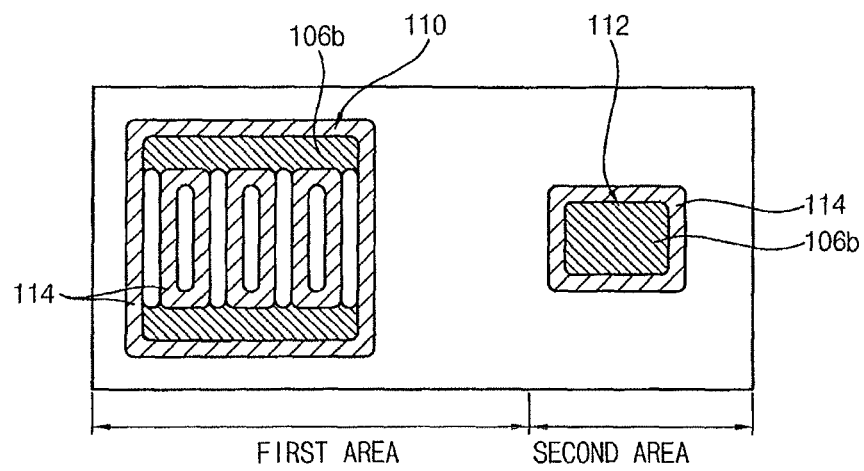

Referring to FIGS. 6A and 6B, the first thin pattern 104a of the first sacrificial pattern 108 may be removed from the substrate 100.

Since the second thin patterns 106b may still remain on the first thin pattern 104b at the second and third sacrificial patterns 110 and 112, the first thin patterns 104b of the second and third sacrificial patterns 110 and 112 may be protected from the etching process for removing the first thin pattern 104a of the first sacrificial pattern 108. Thus, the first thin patterns 104b of the second and third sacrificial patterns 110 and 112 may be prevented from being removed from the substrate 100 by the etching process for removing the first thin pattern 104a, without the need for an additional mask layer for protecting the first thin pattern 104b of the second and third sacrificial patterns 110 and 112. Accordingly, a ring-shaped spacer 114 may remain on the insulation layer 102 in the first area of the substrate 100. Therefore, the first thin pattern 104a of the first sacrificial pattern 108 may be removed from the insulation layer 102 without any additional photolithography process for forming an etching mask pattern for covering the first thin pattern 104b of the second and third sacrificial patterns 110 and 112 due to the three dimensional effect of the thin patterns.

The insulation layer 102 may be partially exposed through the ring-shaped spacer 114 in the first area of the substrate 100. In contrast, the first and second thin patterns 104b and 106b may be still stacked in the second and third sacrificial patterns 110 and 112, and the insulation layer 102 may be still covered with the second and third sacrificial patterns 110 and 112.

Figure 7A:
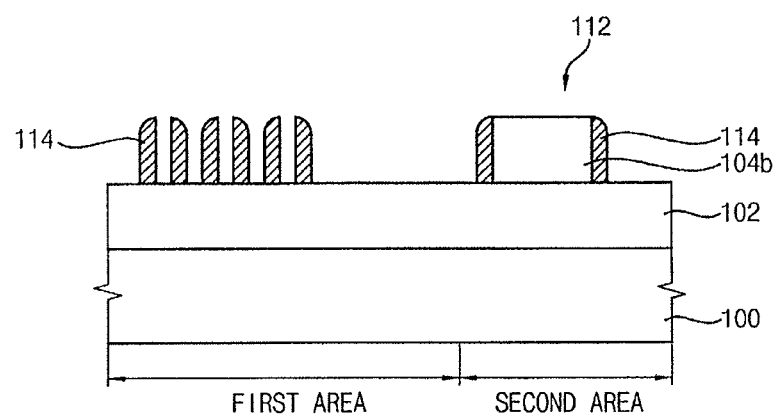
Figure 7B:
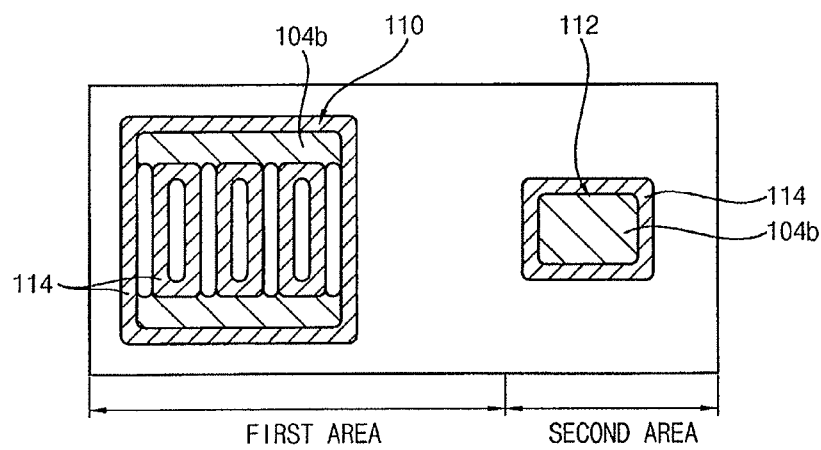

Referring to FIGS. 7A and 7B, the second thin patterns 106b of the second and third sacrificial patterns 110 and 112 may be removed from the first thin pattern 104b, and thus the first thin pattern 104b may remain in the second and third sacrificial patterns 110 and 112. No additional photolithography process may be needed for forming an additional mask layer for an etching process for removing the second thin pattern 106b of the second and third sacrificial patterns 110 and 112. Of course, the second thin pattern 106b of the second and third sacrificial patterns 110 and 112 may not be removed for simplification of the process.

Figure 8A:
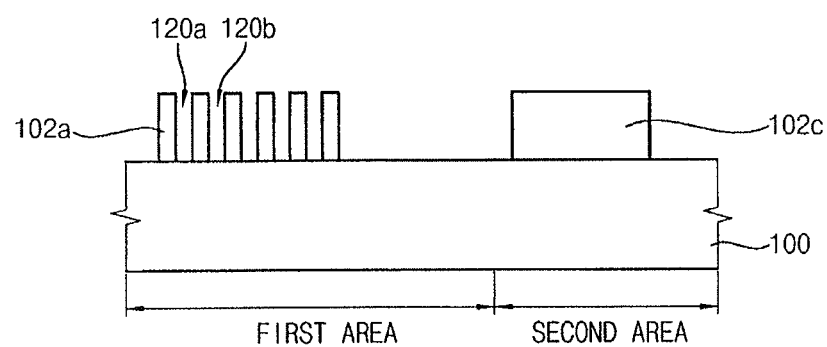
Figure 8B:
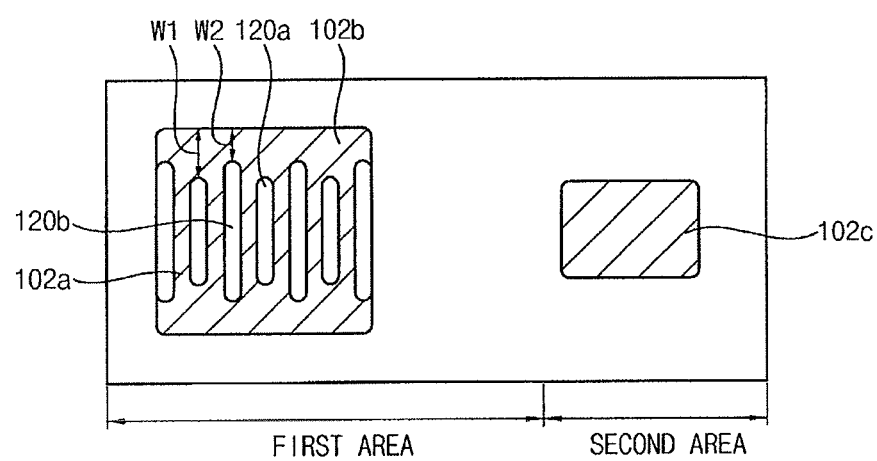

Referring to FIGS. 8A and 8B, the insulation layer 102 may be partially removed from the substrate 100 by an etching process using the spacer 114 and the residuals of the first thin pattern 104b, to thereby form the first, second, and third patterns 102a, 102b, and 102c on the substrate 100.

A plurality of the first patterns 102a may be spaced apart from each other by a gap space, which is referred to as the trench as described above, in the second direction, and each of the first patterns 102a may be shaped into a line extending in the first direction. The second patterns 102b may be coplanar with the first patterns 102a and may be connected with end portions of the first pattern 102a. The third pattern 102c may be formed on the second area of the substrate 100, and may have a width significantly larger than those of the first and the second patterns 102a and 102b.

Since the length of the major axis of the elliptical ring 114 may be shorter than that of a space between the spacers 114, a trench 120a corresponding to an inside of the elliptical ring 114 may be shorter than another trench 120b corresponding to the space between the spacers 114 along the first direction. That is, the longer trenches 120b and the shorter trenches 120a may be alternately arranged in the second direction. In the present example, the even-numbered trench 120a may have a length different from that of the odd-numbered trench 120b in the first direction, and thus the end portions of the trenches 120a and 120b may not be aligned in a line along the second direction.

The width of the second pattern 102b may be determined by a distance from the end portion of the trenches 102a and 102b. Since the lengths of the even-numbered trench 120a and the odd-numbered trench 120b may be different from each other, the width of the second pattern 102b may be varied in accordance with positions of the end portions of the trenches 120a and 120b. Particularly, the second pattern 102b may have a first width W1 from the end portions of the even-numbered trenches 120a and have a second width W2 from the end portions of the odd-numbered trenches 120b. As the odd-numbered trench 120b is longer than the even-numbered trench 120a, the second width W2 may be smaller than the first width W1.

The third pattern 102c may be formed on the second area of the substrate 100 by the same etching process.

As described above, the second thin pattern 106b of the sacrificial pattern may remain on the first thin pattern 104b at a portion at which the pattern needs to have a large width due to the three dimensional effect of the etching process. Therefore, the first pattern 102a having a relatively small width, and the second and third patterns 102b and 102c having a relatively large width, may be formed together with one another by just one photolithography process. Particularly, the first patterns 102a and the second strap-shaped pattern 102b connecting with the end portions of the first patterns 102a may be formed together with each other by just one photolithography process. That is, a plurality of patterns having various shapes, sizes and widths may be formed by just one photolithography process.

Embodiment II

Figure 9:
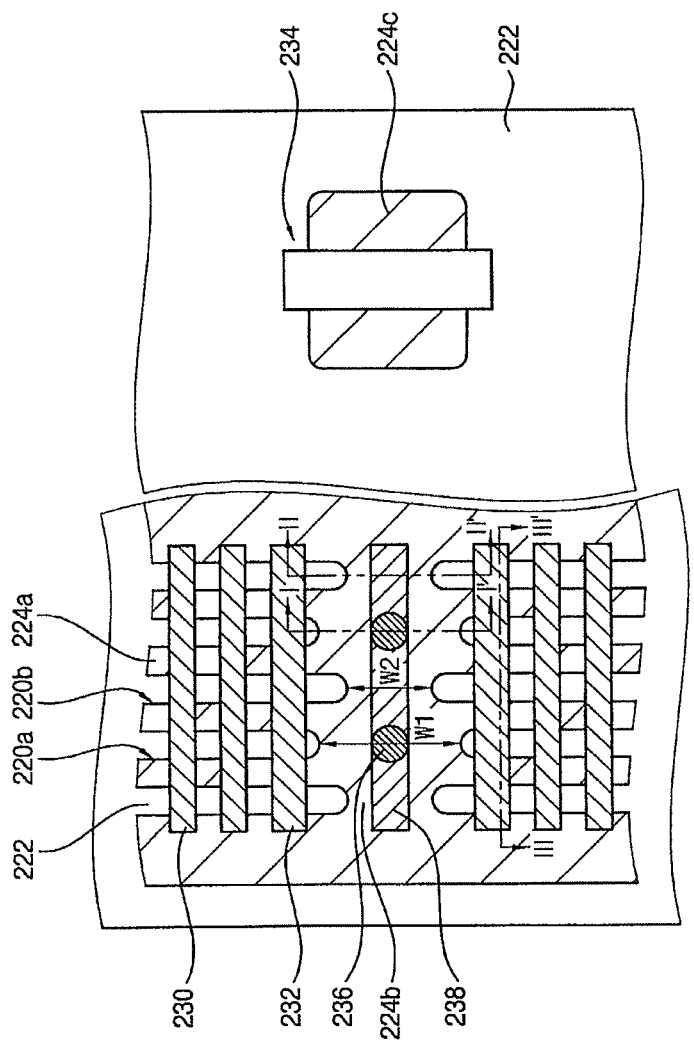
FIG. 9 illustrates a plan view of a NAND flash memory device in accordance with a second example embodiment.
Figure 10:
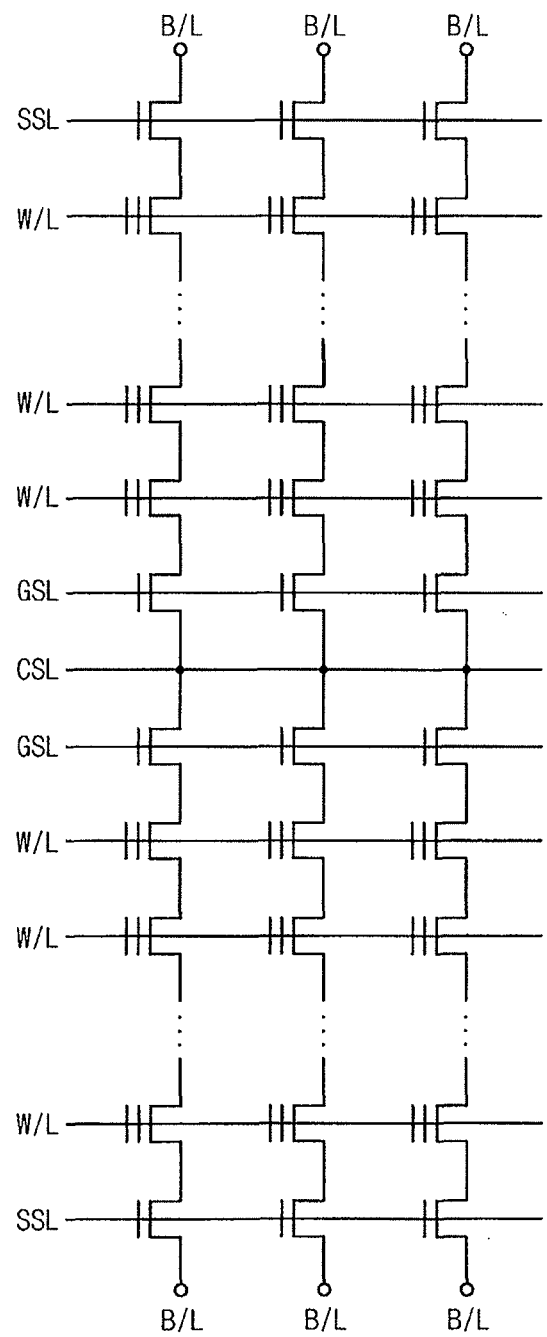
FIG. 10 illustrates a circuit diagram of electronic circuits of the NAND flash memory device shown in FIG. 9.
Figure 11A:
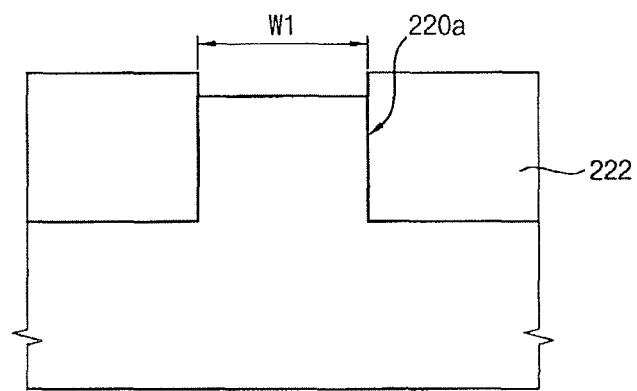
FIG. 11A illustrates a cross-sectional view taken along a line I-I' of FIG. 9.
Figure 11B:
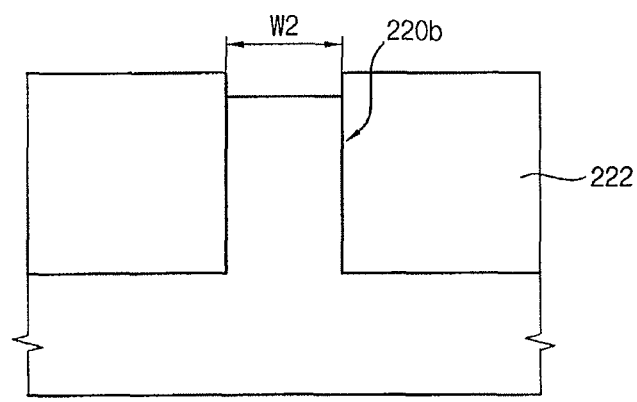
FIG. 11B illustrates a cross-sectional view taken along a line II-II' of FIG. 9.
Figure 12:
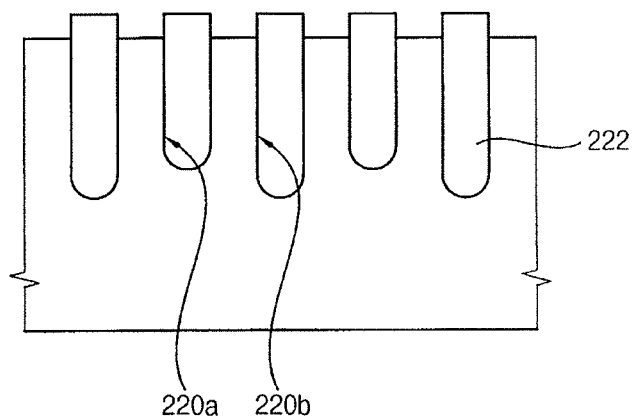
FIG. 12 illustrates a cross-sectional view taken along a line II-III' of FIG. 9.

FIG. 9 illustrates a plan view of a NAND flash memory device in accordance with a second example embodiment. FIG. 10 illustrates a circuit diagram of electronic circuits of the NAND flash memory device shown in FIG. 9. FIG. 11A illustrates a cross-sectional view taken along a line I-I' of FIG. 9 and FIG. 11B illustrates a cross-sectional view taken along a line II-IF of FIG. 9. FIG. 12 illustrates a cross-sectional view taken along a line of FIG. 9.

Referring to FIGS. 9 and 10, a plurality of cells of a NAND memory device may be arranged in a cell region of a substrate. A plurality of transistors for operating peripheral circuits may be arranged in a peripheral region of the substrate.

As shown in FIG. 10, each of the cell strings may include a plurality of word lines (W/L) in the NAND memory device. In the present example embodiment, each cell string may include 32 word lines. A plurality of unit cell transistors (TR) may be connected to the word line (W/L). A string selection line (SSL) and a ground selection line (GSL) may be positioned around a block of the word lines, and thus the word lines may be defined by the SSL and the GSL. A plurality of string selection transistors and a plurality of ground selection transistors may be connected to the SSL and GSL, respectively.

Impurity regions of the string selection transistor may be connected to a bit line (B/L) and impurity regions of the ground selection transistor may be connected to a common source line (CSL). The CSL may extend in parallel with the word line (W/L) and thus each string may be electrically connected to each other by the CSL. In the present example embodiment, neighboring cell string blocks may be symmetrical to each other with respect to the CSL.

The cell string shown in FIG. 10 may be formed as follows. A semiconductor substrate may be divided into an active region and a device isolation region defining the active region, as shown in FIG. 9.

In the active region of the cell area of the substrate, a plurality of first active patterns 224a may be arranged in such a configuration that each of the first active patterns 224a may extend in the first direction and may be spaced apart from each other by a gap distance in the second direction perpendicular to the first direction. A second active pattern 224b may be arranged in the active region of the cell area of the substrate and end portions of the first active patterns 224a may be connected with the second active pattern 224b. The first active pattern 224a may function as an active region for the cell strings and the second active pattern 224b may be shaped into a strap for fastening the end portions of the first active patterns 224a. Further, the second active pattern 224b may function as an active region for the CSL to which the cell strings may be commonly connected.

The second active pattern 224b may extend in the second direction.

Trenches 220a and 220b may be prepared between the first active patterns 224a, and a device isolation pattern 222 may be positioned in the trenches 220a and 220b.

The length of the trenches 220a and 220b may be varied along the first direction. For example, an even-numbered trench 220a may have a length different from that of an odd-numbered trench 220b, and thus end portions of the trenches 220a and 220b may not be aligned in a line along the second direction. In the present example embodiment, the odd-numbed trench 220b may be longer than the even-numbered trench 220a.

As illustrated in FIGS. 11A and 11B, the even-numbered trench 220a is shorter than the odd-numbered trench 220b, and thus a first distance from the end portions of the even-numbered trench 220a to the second active pattern 224b is larger than a second distance from the end portions of the odd-numbered trench 220b to the second active pattern 224b. That is, the second active pattern 224b has a first width W1 corresponding to the first distance and a second width W2 corresponding to the second distance and smaller than the first width W1.

In addition, as illustrated in FIGS. 11A, 11B and 12, a depth of the even-numbered trench 220a may be different from that of the odd-numbered trench 220b. In an example embodiment, a longer trench may have a larger depth, and thus the odd-numbered trench 220b may have a depth larger than that of the even-numbered trench 220a.

A third active pattern 224c having a width larger than that of the first active pattern 224a may be arranged in the peripheral region of the substrate. The third active pattern 224c may function as an active region for the peripheral circuits of NAND memory device.

A cell transistor 230, a word line, and string selection transistor 232 may be arranged on the first active pattern 224a in the cell region of the substrate. For example, the cell transistor may include a tunnel oxide layer, a floating gate electrode, a dielectric layer, and a control gate electrode. The control gate electrode may be commonly shared with the cell transistor 230 and the word line W/L.

A plurality of contact plugs 236 and the CSL making contact with the contact plug 236 may be arranged on the second active pattern 224b in the cell region of the substrate. A metal silicide layer may be interposed between the second active pattern 224b and the contact plug 236. The metal silicide layer may include titanium silicide. For example, the contact plug may include a multi-layered structure in which metal silicide and metal are sequentially stacked alternately with each other.

A plurality of transistors 234 for the peripheral circuits of the NAND memory device may be arranged on the third active pattern 224c.

The second active pattern may have a large surface area, and thus the size of the contact plug for the CSL may be sufficiently increased to thereby minimize the misalignment between the contact plug and the CSL. Further, the metal silicide layer may be stably interposed between the second active pattern and the contact plug to thereby reduce the electrical resistance of the contact plug. Accordingly, the electrical resistance of the CSL and signal noise may be sufficiently reduced in the NAND memory device to thereby improve the performance of the NAND memory device.

Figure 13:
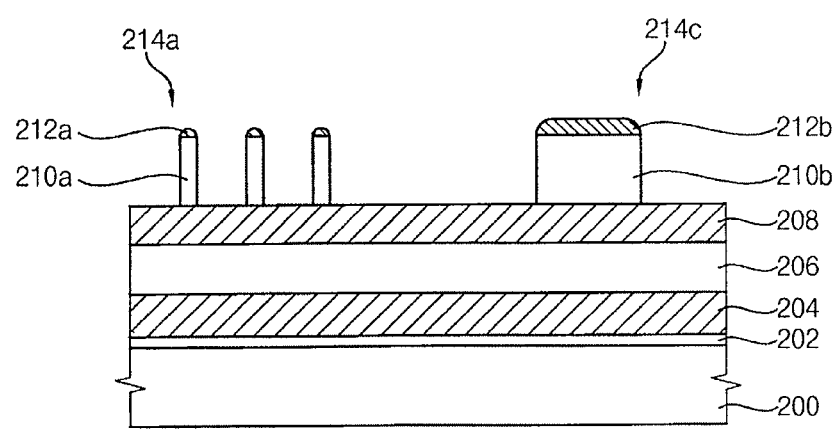
FIG. 13 illustrates a cross-sectional view of a processing step for a method of manufacturing the NAND memory device shown in FIG. 9.

FIG. 13 illustrates a cross-sectional view of a stage in a method of manufacturing the NAND memory device shown in FIG. 9, and FIGS. 14 to 19 illustrate plan views of stages in a method of manufacturing the NAND memory device shown in FIG. 9.

Figure 14:
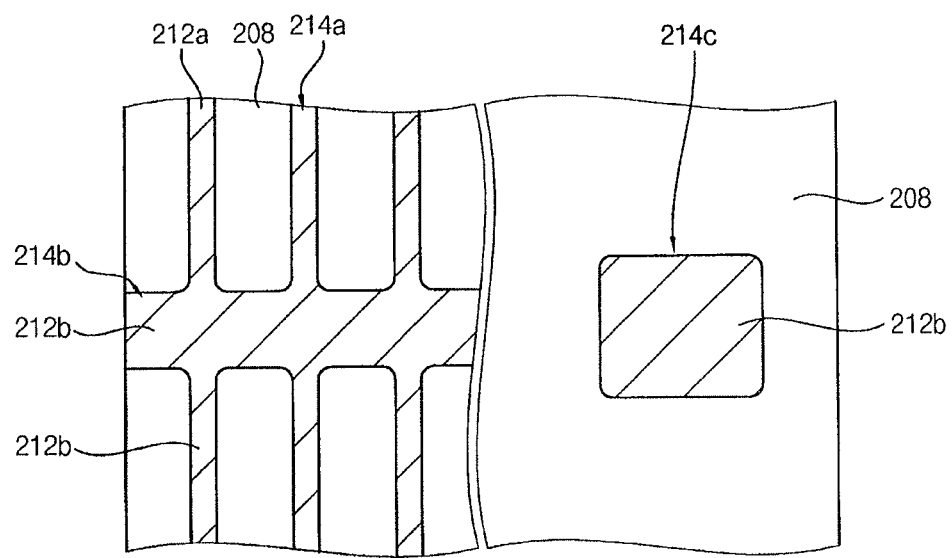
FIGS. 14 to 19 illustrate plan views of processing steps for a method of manufacturing the NAND memory device shown in FIG. 9.
Figure 15:
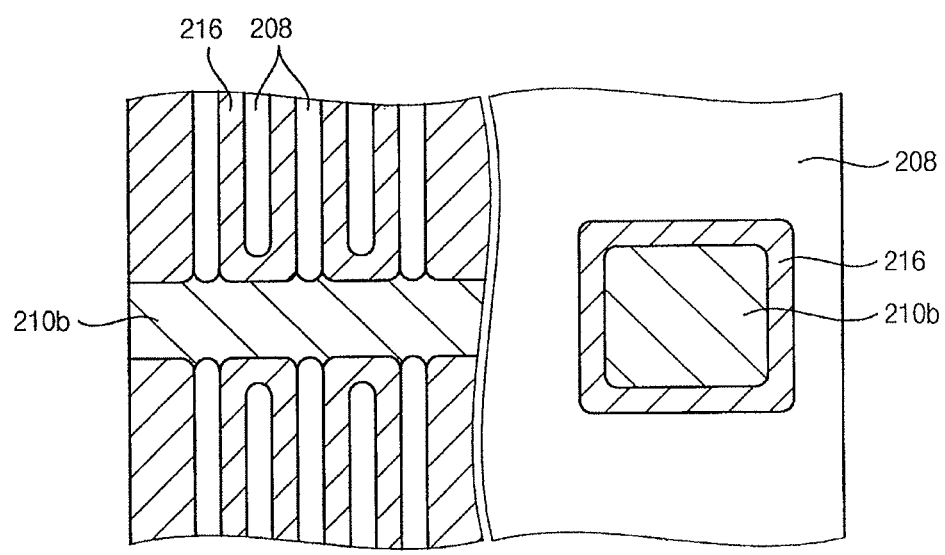

Referring to FIGS. 13 and 14, a substrate 200 may be prepared, and a cell region and a peripheral region may be divided on the substrate 200.

A tunnel oxide layer 202 may be formed on the substrate 200 by, e.g., a thermal oxidation process on the substrate 200.

A floating gate electrode layer 204 may be formed on the tunnel oxide layer 202 by, e.g., a lower pressure chemical vapor deposition (LPCVD) process. For example, the floating gate electrode layer 204 may include polysilicon and may be formed into a floating gate electrode of the NAND memory device in a subsequent process.

A first hard mask layer 206 including, e.g., silicon oxide, may be formed on the floating gate electrode layer 204 by, e.g., a CVD process.

A second hard mask layer 208 including, e.g., polysilicon, may be formed on the first hard mask layer 206. The second hard mask layer 208 may function as an etching mask when the first hard mask layer 206 is to be etched off.

A first thin layer (not shown) may be formed on the second hard mask layer 208. In the present example embodiment, the first thin layer may include a spin-on-hard mask layer (SOH) and/or a carbonized spin-on-hard mask layer (C-SOH). A second thin layer (not shown) may be formed on the first thin layer. The second thin layer may prevent diffused reflection and thus may include silicon nitride or silicon oxynitride.

A photoresist pattern (not shown) may be formed on the second thin layer.

The second thin layer may be partially removed from the first thin layer by an anisotropic etching process using the photoresist pattern as an etching mask to thereby form second thin patterns 212a and 212b. Thereafter, the first thin layer may be partially removed from the second hard mask layer 208 by an anisotropic etching process using the second thin patterns 212a and 212b as an etching mask to thereby form first thin patterns 210a and 210b. Consequently, sacrificial patterns 214a, 214b, and 214c may be formed on the second hard mask layer 208, in which the first and second thin patterns 210a, 210b, 212a, and 212b may be sequentially stacked at the cell region and the peripheral region of the substrate 100, respectively. Particularly, as illustrated in FIG. 14, a plurality of first sacrificial patterns 214a may be formed into a line-and-space structure on the cell region of the substrate 100, and thus each of the sacrificial patterns 214a may extend in the first direction and the first sacrificial patterns 214a may be spaced apart from each other by a gap distance in the second direction. A second sacrificial pattern 214b may also be formed on the cell region of the substrate 100 in such a configuration that end portions of the first sacrificial patterns 214a may be connected with the second sacrificial pattern 214b. The second sacrificial pattern 214b may have a width larger than those of the first sacrificial patterns 214a. A third sacrificial pattern 214c may be formed on the peripheral region of the substrate 100 and may have a width significantly larger than those of the first and the second sacrificial patterns 214a and 214b.

Thereafter, the same processes as described with reference to FIGS. 4A to 7B may be performed on the substrate 200 including the sacrificial patterns 214a, 214b, and 214c. Thus, spacers 216 may be formed on a first area of the cell region of the substrate, and the second hard mask layer 208 may be exposed through the spacers 216 at the first area of the cell region. In the present example embodiment, the spacer 216 may be shaped into an elliptical ring of which the major axis may extend in the first direction.

The first thin pattern 210b of the second and third sacrificial patterns 214b and 214c may still remain on the second hard mask layer 208, and thus the second hard mask layer 208 may be covered with the second and third sacrificial patterns 214b and 214c.

Figure 16:
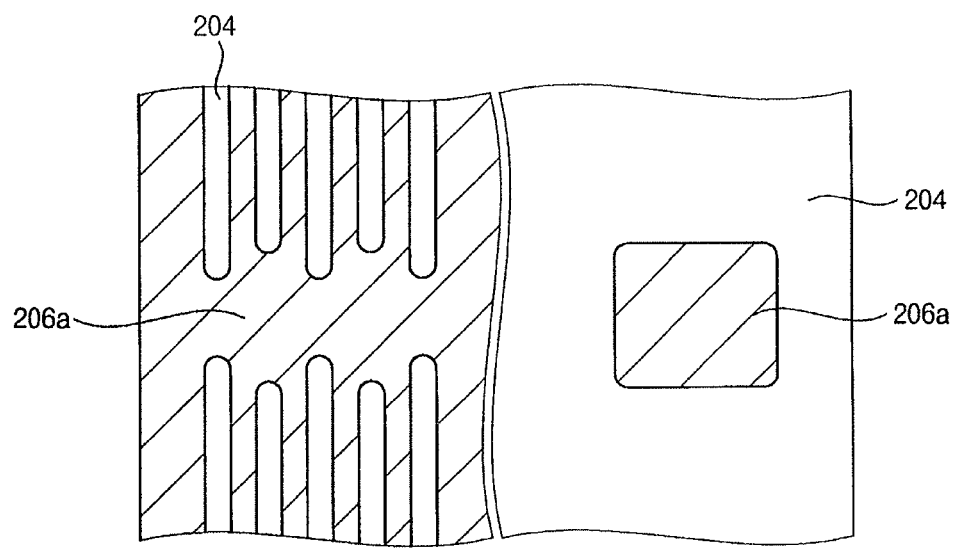

Referring to FIG. 16, the second hard mask layer 208 may be removed from the first hard mask layer 206 by an etching process using the spacers 216 and the residuals of the first thin pattern 210b as an etching mask to thereby form a line-shaped opening. Therefore, a second hard mask pattern may be formed at the first and second areas of the cell region of the substrate. Thereafter, the residuals of the first thin patterns may be removed from the substrate by a cleaning process.

Then, the spacers may be removed from the first area of the cell region. The first hard mask layer 206 may be partially removed from the floating gate electrode 204 by an etching process using the second hard mask pattern as an etching mask. Most of the second hard mask patterns may be removed from the substrate in the etching process for removing the first hard mask pattern to thereby form a first hard mask pattern 206a for patterning an active region. Thus, the first hard mask pattern 206a may be formed into the same shape as the active region of the substrate.

In the present example embodiment, the first hard mask pattern 206a may include a plurality of lines corresponding to cell strings of the NAND memory device and a connector with which end portions of the lines may be connected like a strap. The CSL of the NAND memory device may be connected to the floating gate electrode layer 204 corresponding to the connector of the first hard mask pattern 206a. The lines of the first hard mask pattern 206a may be arranged on the floating gate electrode layer 204 symmetrically with each other with respect to the connector. Thus, the connector of the first hard mask pattern 206a may have a width larger than that of the line of the first hard mask pattern 206.

Merely one photolithography process may be performed for forming the first hard mask pattern 206a on the floating gate electrode layer 204. That is, a plurality of line patterns and a connection pattern for connecting the line patterns and a peripheral pattern having a width larger than those of the line patterns and the connection pattern may be formed on the floating gate electrode layer 204 together with one another by just one photolithography process, thereby reducing process complexity and cost for the first hard mask pattern 206a.

Figure 17:
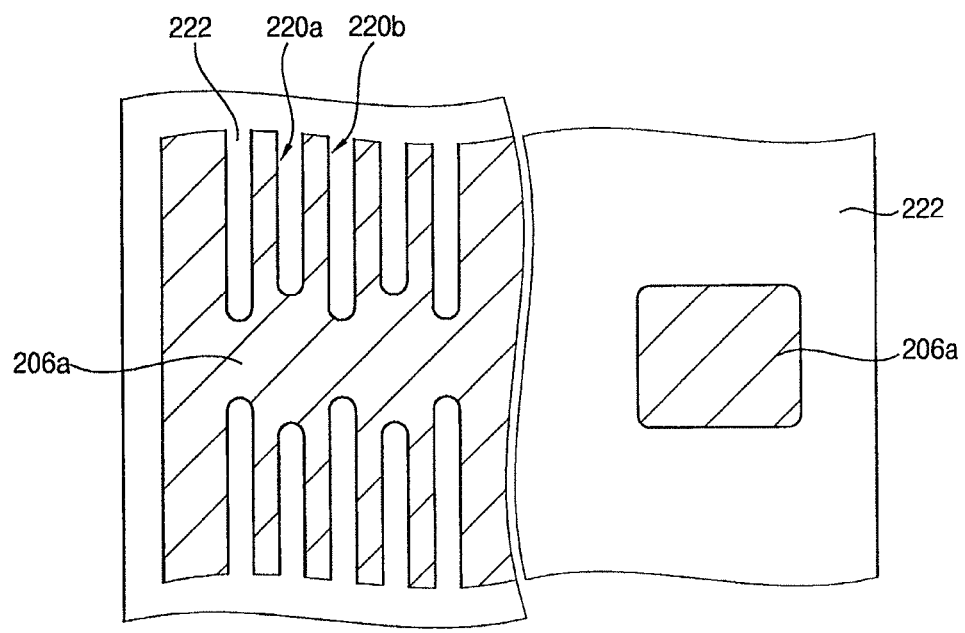

Referring to FIG. 17, the floating gate electrode layer 204 and the tunnel oxide layer may be sequentially removed from the substrate by an etching process using the first hard mask pattern as an etching mask. Then, the substrate may be partially removed by an etching process to thereby form trenches 220a and 20b corresponding to the device isolation region. In such a case, the trench 220a enclosed by the spacers 216 in the first area of the cell region (which may correspond to an inside of the elliptical ring) may have smaller size than that of the trench 220b between the neighboring spacers 216. The trench 220a enclosed by the spacers 216 and the trench 220b between the neighboring spacers 216 may be alternately arranged in the second direction, and may be referred to as even-numbered trench and odd-numbered trench, respectively, so as to differentiate the trenches 220a and 220b. Since the even-numbered trenches 220a may be enclosed by the spacers 216, the even-numbered trenches 220a may be formed to be shorter than the odd-numbered trenches 220b.

When the trenches 220a and 220b are formed by an etching process, the etching rate for forming the even-numbered trench 220a may be smaller than that for forming the odd-numbered trench 220b due to the spacers 216. Thus, the depth of the even-numbered trenches 220a may be smaller than that of the odd-numbered trenches 220b.

The first active patterns 224a may formed into a line shape, and the second active patterns 224b may be formed into a strap to which the end portions of the first active patterns 220a may be connected by the trenches 220a and 220b. The first active patterns 224a may function as an active region for the cell strings and the second active patterns 224b may function as an active region for the CSL. In contrast, the third active patterns 224c may be formed on the peripheral region of the substrate in such a way that the width of the third active pattern 224c may be larger than that of the first and second active patterns 224a and 224b.

The trenches 220a and 220b may be filled with insulation materials to thereby form the device isolation pattern 222 in the trenches 220a and 220b.

Figure 18:
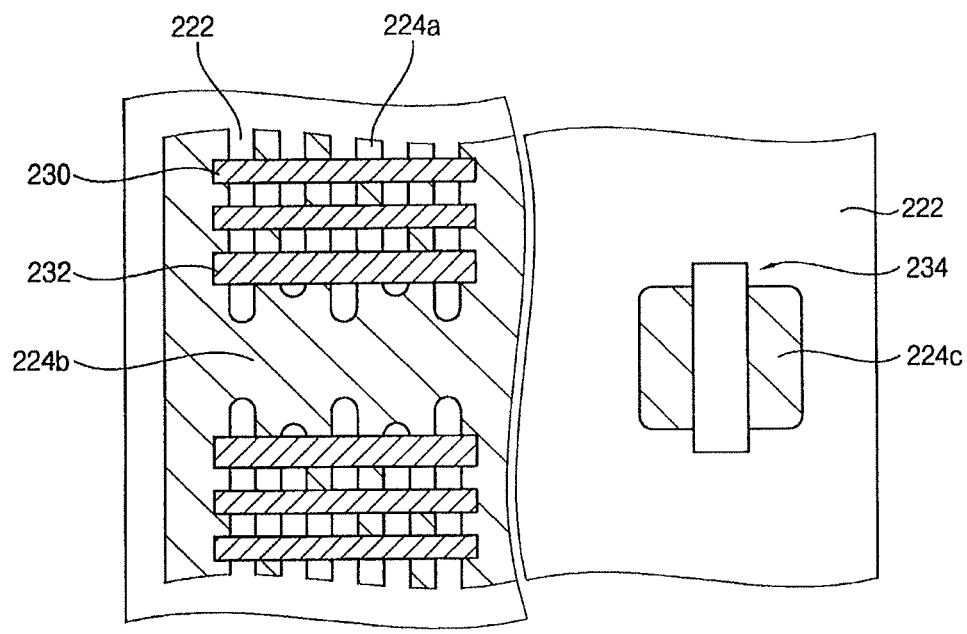

Referring to FIG. 18, the residuals of the patterns and the layers may be removed from the floating gate electrode layer 204, and the dielectric layer and the control gate electrode layer may be sequentially formed on the floating gate electrode layer 204.

The control gate electrode layer, the dielectric layer, and the floating gate electrode layer, which may be stacked on the first active pattern 224a and on the device isolation pattern 222 around the first active pattern 224a, may be sequentially patterned to thereby form a cell transistor 230 in which the tunnel oxide layer, the floating gate, the dielectric pattern, and the control gate are sequentially stacked on the substrate. A string selection transistor 232 may be formed at a side portion of the cell transistor 230 in such a manner that the floating gates and the control gates of the cell transistor 230 and the selection transistor 232 may be electrically connected to each other, respectively. A peripheral transistor 234 for the peripheral circuits may be formed on the third active pattern at the peripheral region of the substrate.

Figure 19:
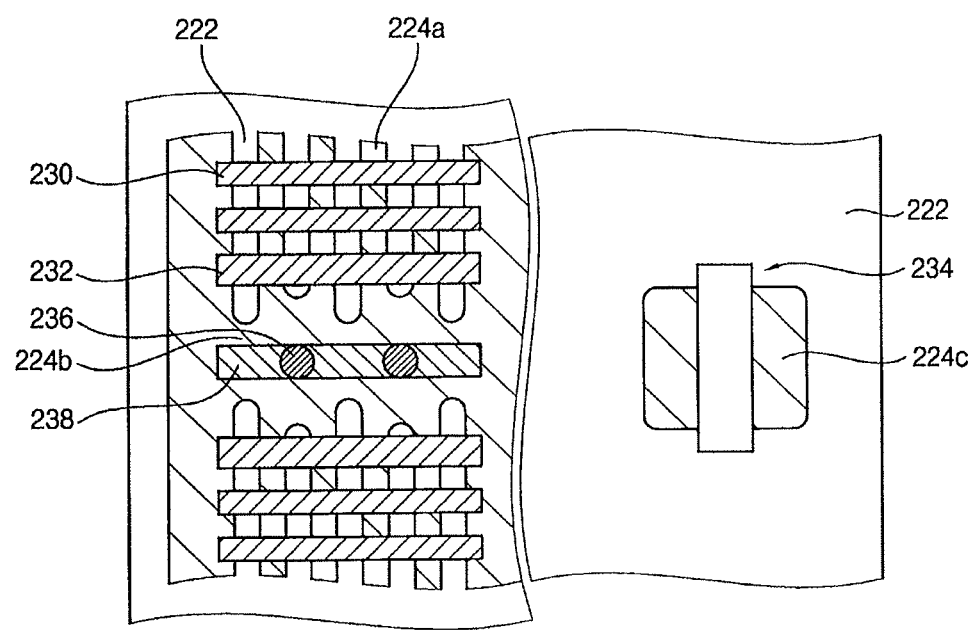

Referring to FIG. 19, an insulation interlayer (not shown) may be formed on the substrate to a sufficient thickness to cover the cell transistors, the selection transistors, and the peripheral transistors.

A plurality of contact plugs 236 may be formed through the insulation interlayer and may make contact with the second active pattern 224b. Since the second active pattern 224b may have a sufficiently large surface area, the contact plug 236 and the second active pattern 224b may make contact with each other at a sufficiently large area, thereby preventing contact failure between the second active pattern 224b and the contact plug 236.

Figure 20:
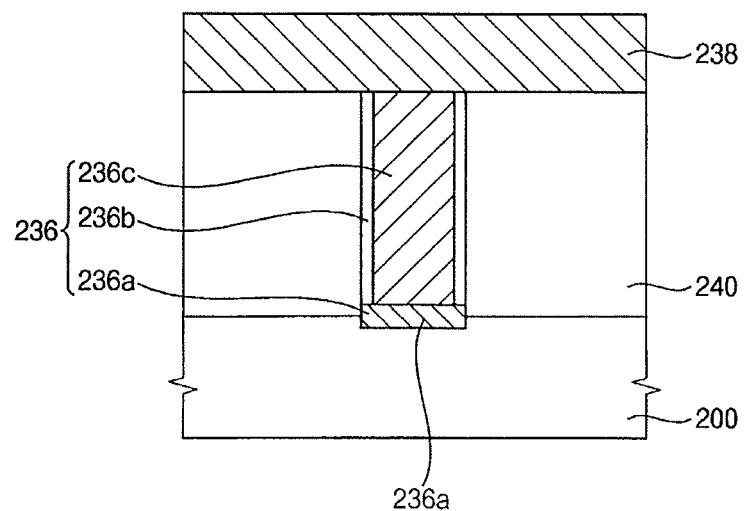
FIG. 20 illustrates a cross-sectional view of the contact plug and the CSL of the NAND memory device shown in FIG. 19.

FIG. 20 illustrates a cross-sectional view of the contact plug and the CSL of the NAND memory device shown in FIG. 19. The method of forming the contact plug 236 will be described in detail with reference to FIG. 20.

Referring to FIG. 20, the insulation interlayer may be partially removed from the substrate to thereby form a contact hole through which the second active pattern 224b may be exposed. A barrier metal layer may be formed on the insulation interlayer, and on the sidewall and bottom of the contact hole. For example, the barrier metal layer may include titanium and titanium nitride.

The barrier metal layer may be chemically reacted with silicon of the second active pattern 224b at the bottom of the contact hole to thereby form a metal silicide 236a at the bottom of the contact hole. In the present example embodiment, since the second active pattern 224b may have a width larger than that of the first active pattern 224a and may be shaped into a strap to which the end portions of the first active pattern 224a may be connected, the substrate may be sufficiently exposed through the contact hole and thus silicon (Si) may be sufficiently provided from the second active pattern 224b in the chemical reaction with the barrier metal. Accordingly, the metal silicide 236 may be formed between the second active pattern 224b and the barrier metal layer at high purity at the bottom of the contact hole.

In contrast, when no second active pattern is formed and the size of the contact hole is small, the substrate may not be sufficiently exposed through the contact hole. Thus, silicon (Si) may not be sufficiently provided from the substrate in the chemical reaction with the barrier metal layer. For that reason, the metal silicide may easily penetrate through the active region of the substrate, to thereby cause a process failure.

Thereafter, a metal layer 236c may be formed on the barrier metal layer to a sufficient thickness to fill up the contact hole. Then, the metal layer 236c may be partially removed by a planarization process until an upper surface of the insulate interlayer is exposed to thereby form the contact plug 236 in the contact hole. Therefore, the contact plug may have a bi-layered structure of the metal silicide layer 236a and the metal layer 236c, and the sidewall of the contact plug may be covered with the barrier metal layer 236b.

The common source line (CSL) 238 may be formed on the insulation interlayer in parallel with the control gate line and may make contact with the contact plug 236. For example, a conductive layer may be formed on the insulation interlayer and may be patterned into the CSL 238.

Embodiment III

Figure 21:
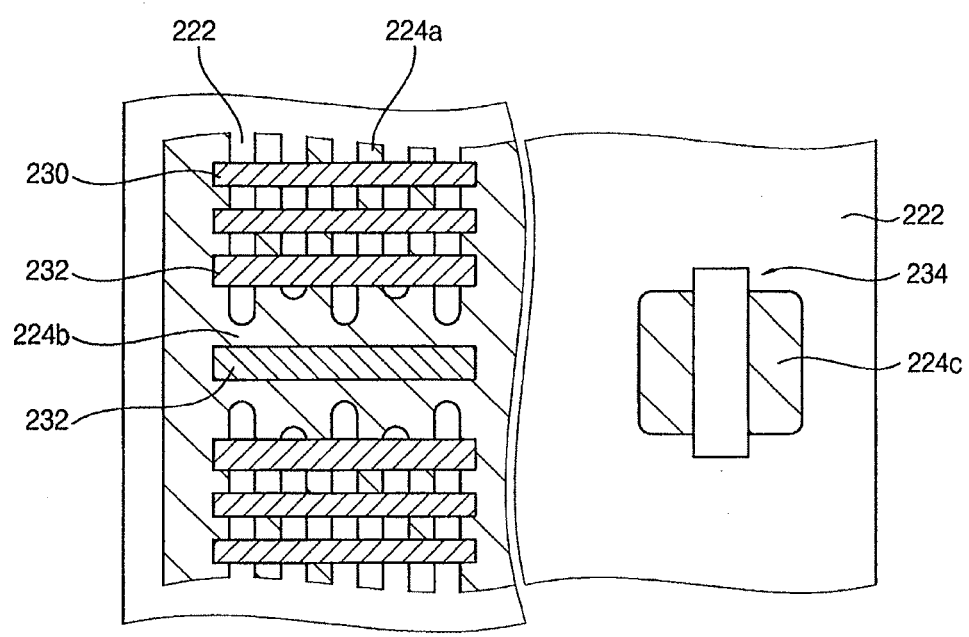
FIG. 21 illustrates a plan view of a NAND flash memory device in accordance with a third example embodiment.
Figure 22:
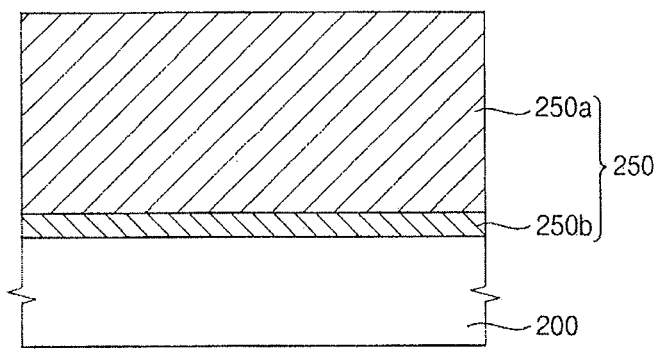
FIG. 22 illustrates a cross-sectional view of the CSL of the NAND flash memory device shown in FIG. 21.

FIG. 21 illustrates a plan view of a NAND flash memory device in accordance with a third example embodiment. FIG. 22 illustrates a cross-sectional view of the CSL of the NAND flash memory device shown in FIG. 21.

The NAND flash memory device in the third example embodiment may have substantially the same structure as the NAND flash memory device in the second example embodiment, except that the CSL may make direct contact with the second active pattern without any additional contact plug. Thus, in FIG. 21, the same reference numeral denotes the same or like elements in FIG. 9.

Referring to FIGS. 21 and 22, a CSL 250 may extend along the second direction and may make direct contact with the second active pattern 224b. For example, the CSL 250 may include a metal silicide layer 250b making contact with the second active pattern and a metal layer or a metal nitride layer 250a on the metal silicide layer 250b. Thus, the electrical resistance of the CSL 250 may be reduced to thereby improve operational characteristics of the NAND flash memory device.

Hereinafter, a method of manufacturing the NAND flash memory device shown in FIG. 21 will be described in detail.

The same processes as described with reference to FIGS. 13 to 18 may be performed on the substrate to thereby form a resultant structure as illustrated in FIG. 18. Then, an insulation interlayer may be formed on the resultant structure to a sufficient thickness to cover the cell transistors, the selection transistors, and the peripheral transistors.

The insulation interlayer may be partially removed from the second active pattern to form a trench extending in the second direction and through which the second active pattern 224b may be exposed.

The barrier metal layer may be formed on the sidewall and the bottom of the trench, and on the insulation interlayer, e.g., by a deposition process. The barrier metal layer may include, e.g., titanium and titanium nitride. The barrier metal layer may be chemically reacted with silicon (Si) of the second active pattern 224b at the bottom of the trench to thereby form a metal silicide layer 250b at the bottom of the trench. Thereafter, a metal layer 250c may be formed on the barrier metal layer and the metal silicide layer 250b to a sufficient thickness to fill up the trench. Then, the metal layer 250c may be partially removed from the insulation interlayer by a planarization process until an upper surface of the insulation interlayer is exposed, thereby forming the CSL 250.

Figure 23:
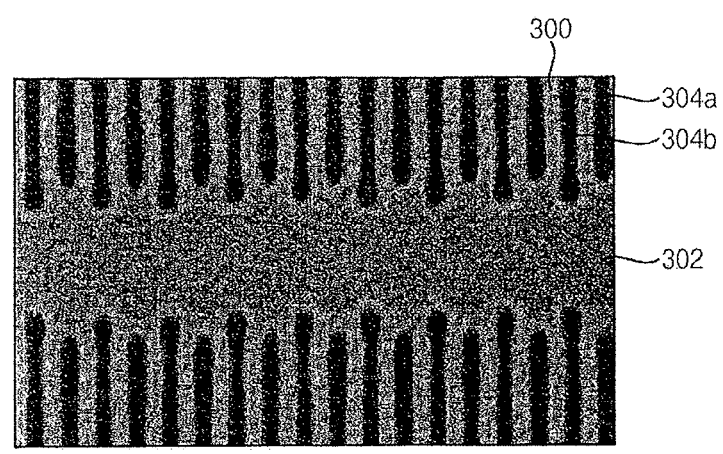
FIG. 23 illustrates a scanning electron microscope (SEM) picture of an active pattern of a NAND flash memory device in accordance with FIG. 9.

FIG. 23 illustrates a scanning electron microscope (SEM) picture of an active pattern of a NAND flash memory device in accordance with FIG. 9.

FIG. 23 shows the first active pattern 300 having a repeated line-and-trench structure, and the second active pattern 302 to which the end portions of the first active pattern 300 are connected like a strap. In addition, the even-numbered trenches 304a and the odd-numbered trenches 304b have different lengths, and the second active pattern 302 may have a sufficiently large surface area. Thus, misalignment between the CSL and the second active pattern 302 may be prevented due to the large surface area of the second active pattern 302.

According to the example embodiments of the present inventive concept, there has been suggested a simplified process for forming a desired pattern structure, for example, especially for a semiconductor device. Particularly, the pattern structure includes an active pattern for a NAND memory device.

Generally, a double patterning process may be used in an effort to overcome the resolution limitations of a photolithography process. According to the double patterning process, a spacer is formed on a sidewall of a first pattern, which is generally formed by a conventional photolithography process, and a subsequent patterning process is performed using the spacer on the first pattern as a mask pattern to thereby form a second pattern on a substrate. However, such a general double patterning process may present difficulties, in that the second pattern is difficult to form in accordance with the features of the first pattern, and thus a single photolithography process may not be sufficient for forming an accurate pattern structure in the double patterning process. For example, an irregular pattern structure, a relatively small pattern, or a large pattern may be very difficult to form merely by a single photolithography process. Thus, the patterning process for forming the fine pattern structure becomes more complicated. However, according to example embodiments described herein, the pattern structure for a semiconductor device may be formed to include a first fine pattern and a second pattern having a width larger than that of the first pattern and to which the end portions of the first pattern may be connected like a strap by just one photolithography process, thereby improving integration degree of the semiconductor device. The pattern structure according to an embodiment may include an active region for a NAND flash memory device, and thus the integration degree of the NAND flash memory device may be increased. Further, a CSL of the NAND flash memory device may be arranged on the second pattern, thereby reducing misalignment between the CSL and the second pattern and electrical resistance of the CSL. In addition, just one photolithography process may be needed for forming the pattern structures, even though the widths of the pattern structures may be different from one another. Thus, according to embodiments, various pattern structures may be formed by a simplified process.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A pattern structure for a semiconductor device, comprising:
   a plurality of first patterns, each of the first patterns extending in a first direction in the shape of a line, neighboring first patterns being spaced apart from each other by a gap distance, the plurality of first patterns including a plurality of trenches in parallel with the line shapes, respective trenches being between neighboring first patterns, the plurality of trenches including long trenches and short trenches alternately arranged in a second direction substantially perpendicular to the first direction;
   at least one second pattern, the at least one second pattern being coplanar with the first patterns, the first patterns and the at least one second pattern each including an active region of a semiconductor substrate, end portions of the first patterns being connected to the at least one second pattern such that the end portions of the first patterns are each integrally connected to the at least one second pattern; and
   a third pattern spaced apart from the first patterns and the at least one second pattern, the third pattern having a width larger than those of the first patterns.

2. The pattern structure as claimed in claim 1, wherein the at least one second pattern includes a first width measured from an end portion of a short trench and a second width measured from an end portion of a long trench.

3. The pattern structure as claimed in claim 1, wherein a conductive line and/or a contact plug is arranged on the second pattern.

4. The pattern structure as claimed in claim 1, wherein the trenches have an isolation pattern therein.

5. The pattern structure as claimed in claim 4, wherein:
   the first patterns and the at least one second pattern include a semiconductor material, and the isolation pattern includes an oxide.

6. A semiconductor device, comprising:
   a plurality of line shaped first active patterns extending in a first direction;
   a second active pattern coplanar with the first active patterns and connecting end portions of the first active patterns such that the first active patterns are each integrally connected to the second active pattern;
   a plurality of long isolation patterns and a plurality of short isolation patterns alternately arranged between the first active patterns; and
   a third active pattern spaced apart from the first active patterns and the second active pattern, the third active pattern having a width larger than those of the first active patterns.

7. The semiconductor device as claimed in claim 6, wherein ends of the long isolation patterns are closer to the second active pattern than ends of the short isolation patterns.

8. The semiconductor device as claimed in claim 6, wherein the long isolation patterns are formed deeper than the short isolation patterns.

9. A semiconductor device, comprising:
   a plurality of line shaped first active patterns and a plurality of line shaped second active patterns, both the first active patterns and the second active patterns extending in a first direction;
   a connecting active pattern connecting end portions of the first active patterns and end portions of the second active patterns such that the end portions of the first active patterns are integrally connected to the end portions of the second active patterns;
   a plurality of first long isolation patterns and a plurality of first short isolation patterns alternately arranged between the first active patterns;
   a plurality of second long isolation patterns and a plurality of second short isolation patterns alternately arranged between the second active patterns; and
   a third active pattern spaced apart from the first active patterns and the second active patterns, the third active pattern having a width larger than those of the first active patterns,
   wherein the first active patterns and second active patterns are symmetrically formed with respect to the connecting active pattern.

10. The semiconductor device as claimed in claim 9, wherein the connecting active pattern has narrow areas between the first long isolation patterns and the second long isolation patterns and wide areas between the first short isolation patterns and the second short isolation patterns.

11. The semiconductor device as claimed in claim 10, further comprising contact plugs formed over the wide areas.

12. The semiconductor device as claimed in claim 9, wherein:
   the first long isolation patterns are formed deeper than the first short isolation patterns, and
   the second long isolation patterns are formed deeper than the second short isolation patterns.

13. The semiconductor device as claimed in claim 9, wherein the second active patterns are coplanar with the first active patterns.

* * * * *